United States Patent [19]
Freymuth

[11] Patent Number: 4,658,203
[45] Date of Patent: Apr. 14, 1987

[54] VOLTAGE CLAMP CIRCUIT FOR SWITCHED INDUCTIVE LOADS

[75] Inventor: William P. Freymuth, Tulsa, Okla.

[73] Assignee: Airborne Electronics, Inc., Plano, Tex.

[21] Appl. No.: 838,425

[22] Filed: Mar. 7, 1986

Related U.S. Application Data

[63] Continuation of Ser. No. 677,796, Dec. 4, 1984, abandoned.

[51] Int. Cl.⁴ ................................................ G05F 1/56
[52] U.S. Cl. ...................................... 323/282; 361/91; 357/23.13
[58] Field of Search ............... 323/282, 284, 286, 287; 361/33, 91, 100, 111; 357/23.13

[56] References Cited

U.S. PATENT DOCUMENTS 4,181,921 1/1980 Taylor et al. ......................... 361/91
4,237,509 12/1980 Asplund ................................ 361/56
4,455,526 6/1984 Miller .................................... 323/282
4,492,974 1/1985 Yoshida et al. ..................... 357/23.13

Primary Examiner—Patrick R. Salce
Assistant Examiner—Anita M. Ault
Attorney, Agent, or Firm—Sigalos & Levine

[57] ABSTRACT

When in control circuit for varying the current through an inductive load the current is sent as pulses of variable width and each time that occurs is cut off by the electronic switch in series with the load across the power line a high inductive voltage is generated. When the electronic switch control terminal is disabled, the electronic switch will turn off and no current can flow through the switch. Thus, the inductive energy in the load, since it cannot continue to flow, generates a very high inductive voltage which can do damage to equipment and personnel. A clamping circuit is provided by means of two series diodes. One diode is a Zener diode with known breakdown potential. The other is a simple diode. The Zener diode has its cathode tied to the junction between the switch and the load and the simple diode has its cathode attached to the control electrode of the electronic switch. When the switch is opened and the inductive voltage appears at the junction between the load and the switch, the voltage tends to flow through the Zener diode and the simple diode. When this current flows through the Zener diode and the simple diode to the control electrode of the electronic switch, the electronic switch will turn on and will momentarily carry to ground the current that wants to flow from the load through the switch to ground. As this current drops to zero, the inductive voltage drops to zero, the electronic switch turns off and the system is disabled until the next control pulse is received on the electronic switch.

2 Claims, 2 Drawing Figures

VOLTAGE CLAMP CIRCUIT FOR SWITCHED INDUCTIVE LOADS

This application is a continuation of application Ser. No. 677,796, filed Dec. 4, 1984, now abandoned.

CROSS-REFERENCE TO RELATED APPLICATIONS

This application is one of a group of three applications, all filed on the same date in the United States Patent and Trademark Office. Each of these separate applications covers one of several different inventions which can be used together in a preferred system or which can be used separately with other types of control apparatus. For example;

Ser. No. 677,754, "A PULSE WIDTH MODULATION CONTROL CIRCUIT WITH A VARIABLE ZERO TO ONE HUNDRED PERCENT DUTY CYCLE", concerns a Variable Pulse Width Modulated apparatus for controlling the average current through a load from zero to one hundred percent. It can be used with a variety of driver circuits driving electronic switches to control the average current and, thus, power through a load.

Ser. No. 677,796, "A VOLTAGE CLAMP CIRCUIT FOR SWITCHED INDUCTIVE LOADS", covers a circuit means for clamping the voltage generated when a load current is cut off by an electronic switch and an inductive voltage is generated trying to maintain the current through the load and the switch, means are provided for limiting this inductive voltage and for using it to momentarily turn the electronic switch back on in order to pass the inductive current which represents the energy still in the load.

Ser. No. 677,758, "A FREE WHEELING DIODE CONTROL CIRCUIT FOR MOTOR SPEED CONTROL WITH REVERSE VOLTAGE PROTECTION", describes a system where the speed of a motor is controlled by a switch means and a free wheeling diode. In such a system, the switch means may, also, have an integral reverse diode, i.e., a Power MOSFET or Darlington Power Transistor. Without proper protection, such a system would present a short circuit to the power supply if the voltage supply is hooked up with reverse polarity. This invention describes a method to protect against this condition.

This application is Ser. No. 677,796.

BACKGROUND OF THE INVENTION

This invention lies in the field of voltage clamp circuits in which a load current is switched on and off. Each time the load current is switched off, high voltage transients are generated due to the load and parasitic lead and wiring inductance. This invention provides a method of clamping this voltage to a preset acceptable level by providing a low power feedback circuit to the switch control logic to momentarily turn the switch back on long enough to dissipate the stored energy through the switch itself. This is accomplished by using inexpensive components in the feedback circuit and the switch itself to protect against high voltage spikes during turn off.

The prior art of this type of invention uses such techniques as a "Clamping Diode" across the load, an "RC Clamp Network" across the switch or an "RC Snubber" across the switch. All of these methods have various shortcomings which this invention overcomes. The primary advantage, however, is that the prior art requires, in addition to a switch capable of handling the voltage and currents of the load, a completely separate circuit to clamp the voltage spikes generated at turnoff. These separate circuits must be rated at the same voltage and current handling capabilities as the switch itself. This results in a duplication of power handling devices in the circuit and, thus, a duplication of costs for the more expensive power devices in the circuit.

SUMMARY OF THE INVENTION

Before explaining in detail and present invention, it is to be understood that the invention is not limited in its application to details of the construction and arrangement of parts illustrated in the accompanying drawings. The invention is capable of other embodiments and of being practiced or carried out in a variety of ways. It is to be understood that the phraseology and terminology employed herein is for the purpose of description and not of limitation.

It is a primary object of this invention to provide a means of quenching the current in a circuit which tends to flow after the switch is opened. In high energy inductive loads such as large motors or generators, this is a very troublesome problem. However, even with small loads, or even with the low inductance of straight wires, if the speed of the switch is fast enough, there can be difficulty because of the inductive action which tends to keep the current flowing even though the curcuit has been opened. When the circuit is opened, and there can be no flow of current, then extremely high voltages can develop at the open end of the inductive line which can be very destructive.

In this invention, a connection is made from the load side of the switch back to the control circuit of the switch using a series Zener diode and a simple diode. The circuit is so designed that when the control electronics turns the switch off and a voltage spike is generated, a point will be reached where the voltage exceeds the breakdown value of the Zener diode. The Zener diode will then begin to conduct through the regular diode back to the control electronics, thus, turning the switch back on until the inductive voltage is dissipated. The regular diode is included in the circuit to prevent the normal operation of the control electronics from shorting when the switch is turned on.

BRIEF DESCRIPTION OF THE DRAWINGS

These and other objects and advantages of this invention and a better understanding of the principles and details of the invention will be evident from the following description taken in conjunction with the appended drawings, in which.

DESCRIPTION OF THE PREFERRED EMBODIMENT

Figure 1:
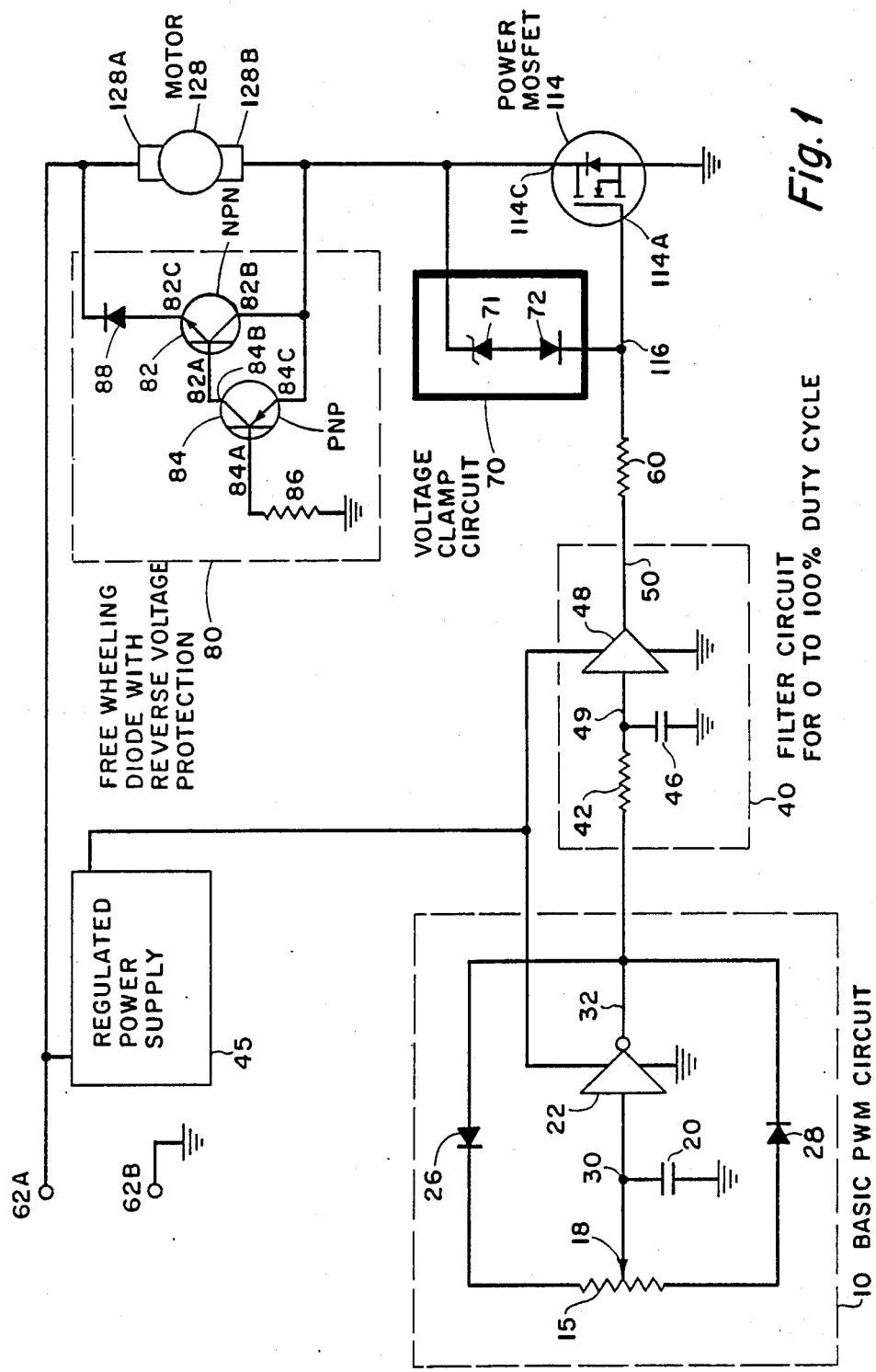
FIG. 1 is a schematic diagram of a complete circuit using a voltage clamp circuit for switched inductive loads.

Referring now to the drawings and in particular to FIG. 1, a D.C. power supply is indicated by the terminals 62A and 62B with terminal 62A being the positive voltage and terminal 62B the negative voltage which is connected to ground. The positive power voltage goes to a motor 128 which has terminals 128A and 128B. Terminal 128A is connected to the power supply, and terminal 128B is connected to an electronic switch circuit 114. The box 80 refers generally to a free wheeling diode circuit.

A Pulse Width Modulation Control Circuit is indicated generally by 10 with output 32 which goes to a Filter Circuit indicated generally by 40 with output 50. The output 50 is a Variable Pulse Width Modulated control signal with zero to one hundred percent duty cycle used to control the Switch 114. Output 50 is connected to the Switch 114 at gate 114A through a Resistor 60. A Regulated Power Supply for the control circuits is indicated generally by 45.

A Voltage Clamp circuit is shown generally by 70. The cathode of a Zener diode 71 is connected to the Motor terminal 128B and the Switch terminal 114C. The anode of the Zener diode is connected to the anode of diode 72. The cathode of diode 72 is connected to the gate 114A of the Power MOSFET 114 switch. The purpose of this circuit is to provide a means for clamping the voltage generated when the load current is cut off by the switch and an inductive voltage is generated trying to maintain the current through the load and the switch. The circuit provides for feedback to the control electronics to momentarily turn the switch back on in order to pass the inductive current which represents the energy still in the load and, thus, limiting the inductive voltage.

Figure 1A:
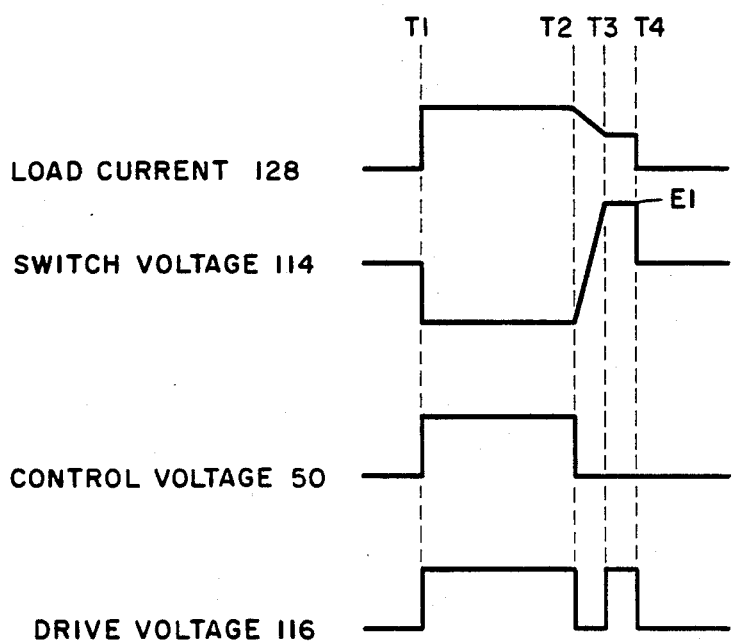
FIG. 1A is an additional view of the circuit of FIG. 1 to illustrate the details of operation.

This is shown more clearly by the waveforms in FIG. 1A to which reference is now made. The top waveform is the current through the load 128 and switch means. The next lower waveform depicts the voltage across the switch 114. The next lower waveform is the Control Voltage 50 from the control circuit. The bottom waveform is the Drive Voltage 116 applied to the gate 114A of switch 114.

The operation of the circuit is as follows: at time T1 the control circuit turns the switch on as can be seen by the Control Voltage 50 going high, which causes the Drive Voltage 116 to go high, causing the Switch Voltage 114 to go low, indicating a closed switch, and the Load Current 128 to rise. At time T2, the control circuit turns the switch off as can be seen by Control Voltage 50 going low, which causes the Drive Voltage 116 to go low, causing the Switch Voltage 114 to begin to go high, indicating an open switch, and the Load Current 128 to begin to decrease. The rapid decrease in Load Current 128 between time T2 and T3 causes a corresponding rapid increase in the Switch Voltage 114. Without some type of protection circuitry, the voltage across Switch 114 could reach a value many times higher than the input power supply voltage across terminal 62A and 62B in FIG. 1.

In the circuit described here, this voltage spike is clamped in the following manner. The Zener diode 71 has a breakdown voltage of value E1. In FIG. 1A, as the Switch Voltage 114 at time T2 begins to rise, it will at time T3 reach the breakdown voltage E1 of the Zener diode 71. When this occurs, current will then flow from the load side at point 114C of Switch 114 through Zener diode 71 through diode 72 to the Switch gate 114A. This will then raise the Drive Voltage 116 turning switch 114 back on. From time T3 to T4, the load current 128 representing the energy stored in the circuit flows through Switch 114 maintaining Switch Voltage 114 at voltage E1. At time T4, the energy stored in the circuit is sufficient to maintain voltage E1 on Switch Voltage 114. Thus, at time T4, the Zener diode stops conducting, the Drive Voltage 116 drops back low turning Switch 114 off again and the Switch Voltage 114 drops on down to the supply voltage and the Load Current 128 drops to zero.

What has been shown is a circuit which facilitates the removal of the inductive voltage peaks which follow each interruption of current through the load.

The particular circuitry claimed in this application is shown in the box 70 of FIG. 1 and comprises a Zener diode 71 in series with a diode 72 connecting the load side of the switch back to the switch control circuit. The circuitry in box 70 is preferably operated with a power MOSFET electronic switch, in series with the motor load and is preferably controlled by a Pulse Width Modulated signal. However, the circuit 70 can be used with other types of loads or with other types of electronic switches, such as transistors, or with other types of control signals, and so on. It will be broadly claimed in this application to be applied in a wide range of circuits for a single purpose, namely, to control the magnitude of the inductive voltage generated by a load when the current through the load is sharply cut to zero.

While the invention has been described with a certain degree of particularity, it is mainfest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

What is claimed is:

1. In a control system in which a current is passed through an inductive load by controlling an electronic switch means in series with said inductive load across a power supply by opening and closing said switch with a control voltage on a control voltage lead; the improvement comprising means to clamp the inductive voltage generated by said inductive load as said current flowing through said load is cut off by the opening of said electronic switch means with said control voltage, said clamp means further comprising;
   (a) circuit means having a first terminal connected to the junction of said load and switch; and a second terminal connected to said control voltage lead; and
   (b) said circuit means having a Zener diode and a simple diode connected in series with either their cathodes together, or their anodes together, and the cathode of said simple diode connected toward said control voltage lead, and the cathode of said Zener diode connected toward said first terminal; whereby when the control voltage is removed from said electronic switch means, said electronic switch means opens, and an inductive voltage peak appears on said first terminal; current flows in reverse through said Zener diode and through said simple diode thereby generating a control voltage to turn on said electronic switch means passing current through said switch until the inductive voltage is dissipated; removing said generated voltage from said control lead and opening said electronic switch means until the next load carrying cycle begins.

2. The apparatus as in claim 1 in which the electronic switch means comprises at least one Power MOSFET as said switch means.

* * * * *